US010992049B2

(12) United States Patent
Cao et al.

(10) Patent No.: US 10,992,049 B2
(45) Date of Patent: Apr. 27, 2021

(54) ELLIPTICALLY POLARIZED CAVITY BACKED WIDEBAND SLOT ANTENNA

(71) Applicant: Nokia Shanghai Bell Co., Ltd., Shanghai (CN)

(72) Inventors: Yan Cao, Mount Waverley (AU); Jonathan Chi, Wantirna South (AU)

(73) Assignee: Nokia Shanghai Bell Co., Ltd., Shanghai (CN)

( * ) Notice: Subject to any disclaimer, the term of this patent is extended or adjusted under 35 U.S.C. 154(b) by 66 days.

(21) Appl. No.: 15/903,218

(22) Filed: Feb. 23, 2018

(65) Prior Publication Data

US 2019/0267715 A1 Aug. 29, 2019

(51) Int. Cl.

| | |
|---|---|
| ***H01L 35/00*** | (2006.01) |
| ***H01Q 11/10*** | (2006.01) |
| ***H01Q 21/24*** | (2006.01) |
| ***H01Q 9/28*** | (2006.01) |
| ***H01Q 5/378*** | (2015.01) |
| ***H01Q 21/26*** | (2006.01) |
| *H01Q 1/38* | (2006.01) |

(52) U.S. Cl.
CPC ........... *H01Q 11/105* (2013.01); *H01Q 5/378* (2015.01); *H01Q 9/285* (2013.01); *H01Q 21/245* (2013.01); *H01Q 21/26* (2013.01); *H01Q 1/38* (2013.01)

(58) Field of Classification Search
CPC .. H01Q 9/16; H01Q 5/48; H01Q 5/40; H01Q 21/28; H01Q 21/30; H01Q 9/28; H01Q 21/08
USPC .... 343/700 R, 705–708, 767, 768, 793–824, 343/833, 834; 342/361–366
See application file for complete search history.

(56) References Cited

U.S. PATENT DOCUMENTS

| | | | | |
|---|---|---|---|---|
| 6,028,563 | A * | 2/2000 | Higgins | H01Q 1/246 343/797 |
| 6,703,975 | B1 | 3/2004 | Freeman | |
| 6,717,555 | B2 | 4/2004 | Teillet et al. | |
| 2003/0112200 | A1 | 6/2003 | Marino | |
| 2005/0253769 | A1* | 11/2005 | Timofeev et al. | H01Q 1/246 343/797 |
| 2006/0033670 | A1 | 2/2006 | Schadler | |
| 2014/0139387 | A1* | 5/2014 | Jones et al. | H01Q 21/30 343/794 |

FOREIGN PATENT DOCUMENTS

| | | |
|---|---|---|
| CN | 103646271 A | 3/2014 |
| EP | 2 120 293 A1 | 11/2009 |

(Continued)

OTHER PUBLICATIONS

Jaegeun Ha et al., “High Efficiency Cavity-Backed Log-Periodic Antenna,” IEEE, pp. 1318-1320, 2014.

(Continued)

*Primary Examiner* — Binh B Tran
(74) *Attorney, Agent, or Firm* — Fay Sharpe LLP

(57) ABSTRACT

An elliptically polarized cavity backed wideband slot antenna with a planar log-periodic dipole is provided. Sufficiently large bandwidth is achieved with careful design of the dipole. Also, the antenna has constant E-field distribution and good impedance properties, and ensures a constant power ratio for vertical polarization and horizontal polarization over a broad frequency band.

19 Claims, 8 Drawing Sheets

(56) References Cited

FOREIGN PATENT DOCUMENTS

| | | | |
|---|---|---|---|
| WO | WO 2013/000519 | A2 | 1/2013 |
| WO | WO 2017/175155 | A1 | 10/2017 |

OTHER PUBLICATIONS

Yao Wang et al., "Wideband cavity-backed log-periodic-slot end-fire antenna with vertical polarization for conformal application," International Journal of RF and Microwave Computer-Aided Engineering, Wiley Periodicals, Inc., pp. 308-312, 2017.

G. Krishna Reddy et al., "Wideband Four Arm Log-Periodic Planar Antenna with Wi-Fi Band Rejection," 2017 IEEE 3rd International Conference on Sensing, Signal Processing and Security (ICSSS), pp. 308-312, 2017.

Xue Bai et al., "Wideband Millimeter-Wave Elliptical Cavity-Backed Antenna for Circularly Polarized Radiation," IEEE Antennas and Wireless Propagation Letters, vol. 15, pp. 572-575, 2016.

John L. Schadler, "Broadband Slotted Coaxial Broadcast Antenna Technology," 7 pages, at least as early as May 17, 2014 (according to Wayback Machine (Internet Archive)).

Xiaoyi Yang et al., "Design of Log-periodic Slot Antenna Array with Novel Cavity," Fire Control & Command Control, vol. 41, No. 5, pp. 134-136, May 2016.

Zhiya Zhang et al., "Ultra-Wideband Cavity-Backed Bowtie Antenna for Pattern Improvement," Progress in Electromagnetics Research Letters, vol. 37, pp. 37-46, 2013.

Xiaoyu He et al., A Wide-Band Wide-Beam Printed Dipole Antenna for Spectrum Monitoring Applications Science Technology and Engineering, No. 17, vol. 15, 4 pages, 2015.

International Search Report for PCT/CN2019/075914 dated May 21, 2019.

"Cavity-Backed Slot Antennas," www.antenna-theory.com, (4 pages) (printed Jun. 3, 2019) (copyright date 2009-2011).

* cited by examiner

ELLIPTICALLY POLARIZED CAVITY BACKED WIDEBAND SLOT ANTENNA

TECHNICAL FIELD

The present exemplary embodiments relate to the field of radio frequency communications, finding particular application in the field of antennas, and will be described with particular reference thereto.

BACKGROUND

Many forms and types of antennas and/or antenna systems are proliferated throughout the various communication networks to transmit and receive signals. However, the market now seeks to have antenna systems that provide 30% radiation power on vertically polarized radiation vs. 100% radiation power on horizontally polarized radiation. Note that it is a convention among North-American broadcasters to state the polarization power as 0 to 100% for each component which may appear as if the total radiation is more than 100%. Nonetheless, such radiation patterns typically improve reception and, because of a diversity of polarization patterns (e.g. horizontal and vertical), allow for an increased likelihood of better reception.

A way to achieve vertical and horizontal polarization is to modify horizontally polarized antenna systems with a vertical component. Such an approach is used for narrowband slot antennas. For example, adding a conventional slant parasitic dipole to a horizontally polarized slot antenna to achieve elliptical or circular polarization is a commonly used technique in the narrowband slot antenna field. In this regard, the technology of adding a slant parasitic dipole to a slot antenna to achieve circular or elliptical polarization is published in “Broadband Slotted Coaxial Broadcast antenna Technology” by John L. Schadler—Dielectric L.L.C. However, performance to meet the industry expectations in these prior systems is limited to specific channels. That is, even if these devices are able to radiate over a range, say 470 MHz to 700 MHz, only a limited number of channels within that range perform at an acceptable level.

Accordingly, it is difficult to achieve satisfactory broadband antenna performance because a constant power ratio, like 30% for the vertical polarization and 100% for the horizontal polarization over the entire broad frequency bandwidth of 470 MHz to 700 MHz, is required.

Known techniques still do not sufficiently address this problem so achieving improved broadband antenna performance at satisfactory levels is challenging.

BRIEF DESCRIPTION

In one aspect of the presently described embodiments, an antenna comprises a cavity backed slot antenna portion, and a planar log periodic parasitic dipole portion positioned in spaced relation to the cavity backed slot antenna portion.

In another aspect of the presently described embodiments, the cavity backed slot antenna portion and the planar log periodic parasitic dipole portion are configured to produce elliptically polarized radiation patterns.

In another aspect of the presently described embodiments, the planar log periodic parasitic dipole portion has a dipole angle and teeth, the dipole angle and teeth being configured to define impedance of the antenna.

In another aspect of the presently described embodiments, a plurality of planar log periodic parasitic dipole portions are positioned along a length of the cavity backed slot antenna portion.

In another aspect of the presently described embodiments, the cavity backed slot antenna portion includes a coupling device aligned with the planar log periodic parasitic dipole portion.

In another aspect of the presently described embodiments, the coupling device comprises plates connected by a conducting bar.

In another aspect of the presently described embodiments, an antenna comprises a cavity backed slot antenna portion including a coupling device configured to provide radio frequency excitation for the antenna, and a planar log periodic parasitic dipole portion positioned in spaced relation to the cavity backed slot antenna portion and aligned with the coupling device, the planar log periodic parasitic dipole portion having a dipole angle and teeth.

In another aspect of the presently described embodiments, the dipole angle and teeth are configured to define impedance of the antenna.

In another aspect of the presently described embodiments, the antenna further comprises a plurality of planar log periodic parasitic dipole portions positioned along a length of the cavity backed slot antenna portion.

In another aspect of the presently described embodiments, the antenna further comprises a plurality of coupling devices in the cavity backed slot antenna portion, each aligned with a single planar log periodic parasitic dipole portion.

In another aspect of the presently described embodiments, the coupling device comprises plates connected by a conducting bar.

In another aspect of the presently described embodiments, an antenna array comprises a cavity backed slot antenna portion including a plurality of coupling devices configured to provide radio frequency excitation for the antenna array, the plurality of coupling devices being positioned along a length of the cavity backed slot antenna portion, and a plurality of planar log periodic parasitic dipole portions positioned in spaced relation to the cavity backed slot antenna portion, each of the plurality of planar log periodic parasitic dipole portions being aligned with a single coupling device, the planar log periodic parasitic dipole portions each having a dipole angle and teeth.

In another aspect of the presently described embodiments, the dipole angle and teeth are configured to define impedance of the antenna.

In another aspect of the presently described embodiments, each coupling device comprises plates connected by a conducting bar.

In another aspect of the presently described embodiments, the antenna array further comprises dividing walls positioned in the cavity backed slot antenna portion to separate coupling devices.

In another aspect of the presently described embodiments, a system comprises a communication device comprising at least one of a transmitter and a receiver and an antenna coupled to at least one of the transmitter and the receiver of the communication device, the antenna comprising a cavity backed slot antenna portion and a planar log periodic parasitic dipole portion positioned in spaced relation to the cavity backed slot antenna portion.

In another aspect of the presently described embodiments, the communication device is a base station.

In another aspect of the presently described embodiments, the cavity backed slot antenna portion and the planar log periodic parasitic dipole portion are configured to produce elliptically polarized radiation patterns, the planar log parasitic dipole portion having a dipole angle and teeth.

In another aspect of the presently described embodiments, a plurality of planar log periodic parasitic dipole portions are positioned along a length of the cavity backed slot antenna portion.

In another aspect of the presently described embodiments, the cavity backed slot antenna portion includes a coupling device aligned with the planar log periodic parasitic dipole portion, the coupling device being configured to provide radio frequency excitation for the antenna.

BRIEF DESCRIPTION OF THE DRAWINGS

FIG. 5(*b*) is a representative view of an implementation of an example of the presently described embodiments;

DETAILED DESCRIPTION

The presently described embodiments are directed to elliptically polarized cavity backed wideband slot antennas. An elliptically polarized cavity backed wideband slot antenna according to the presently described embodiments combines a horizontally polarized cavity backed slot antenna with a planar log periodic parasitic dipole. This combination of elements allows the antenna array to form a desired elliptically polarized radiation pattern.

Implementation of the presently described embodiments results in advantages of obtaining large bandwidth with careful design of the dipole, e.g. the dipole angle and the dimensions of the teeth, providing constant E-field distribution, providing good impedance properties, and ensuring constant power ratio for both vertical and horizontal polarizations.

Figure 1:
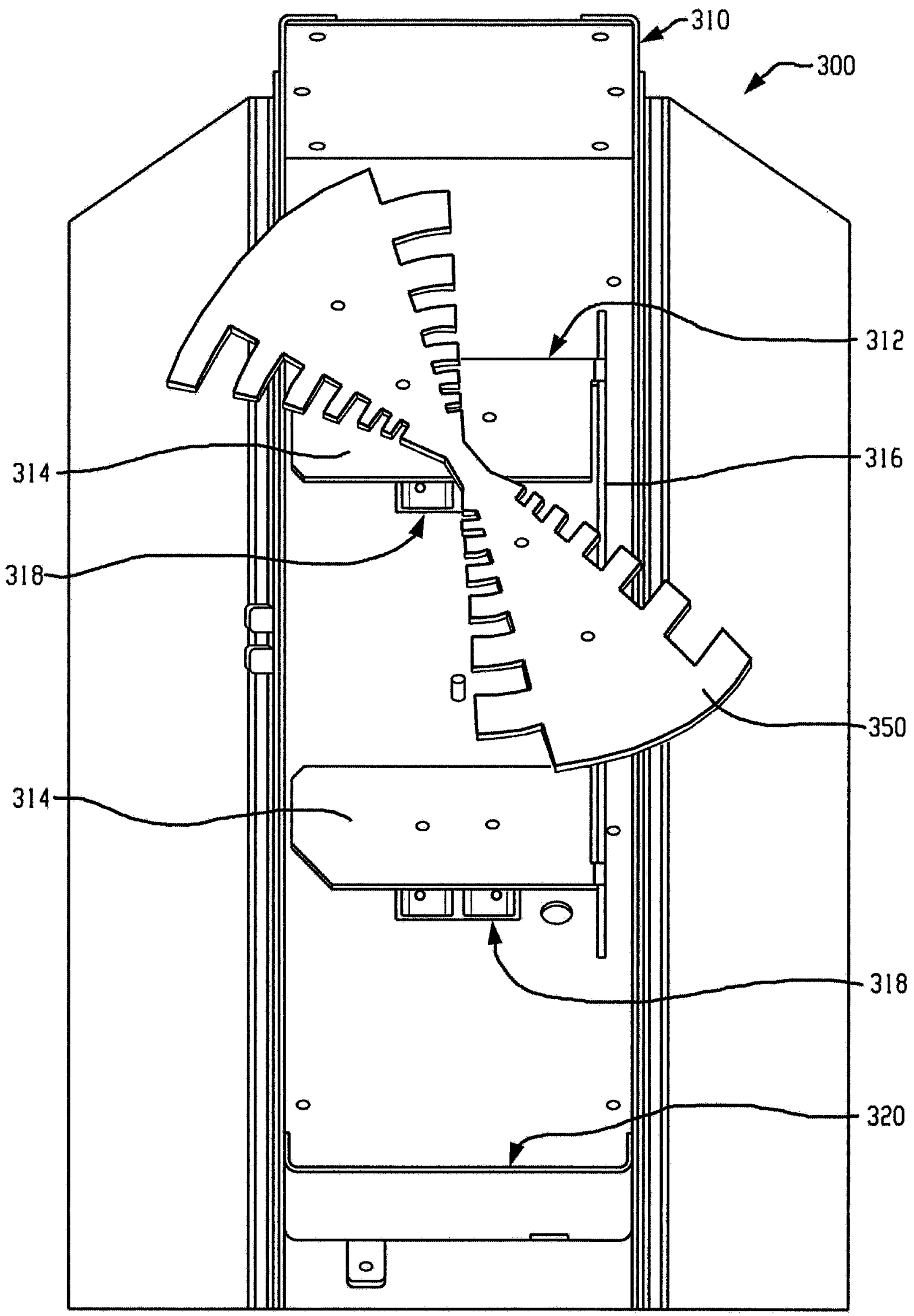
FIG. 1 is a perspective view of an example of the presently described embodiments.
Figure 2:
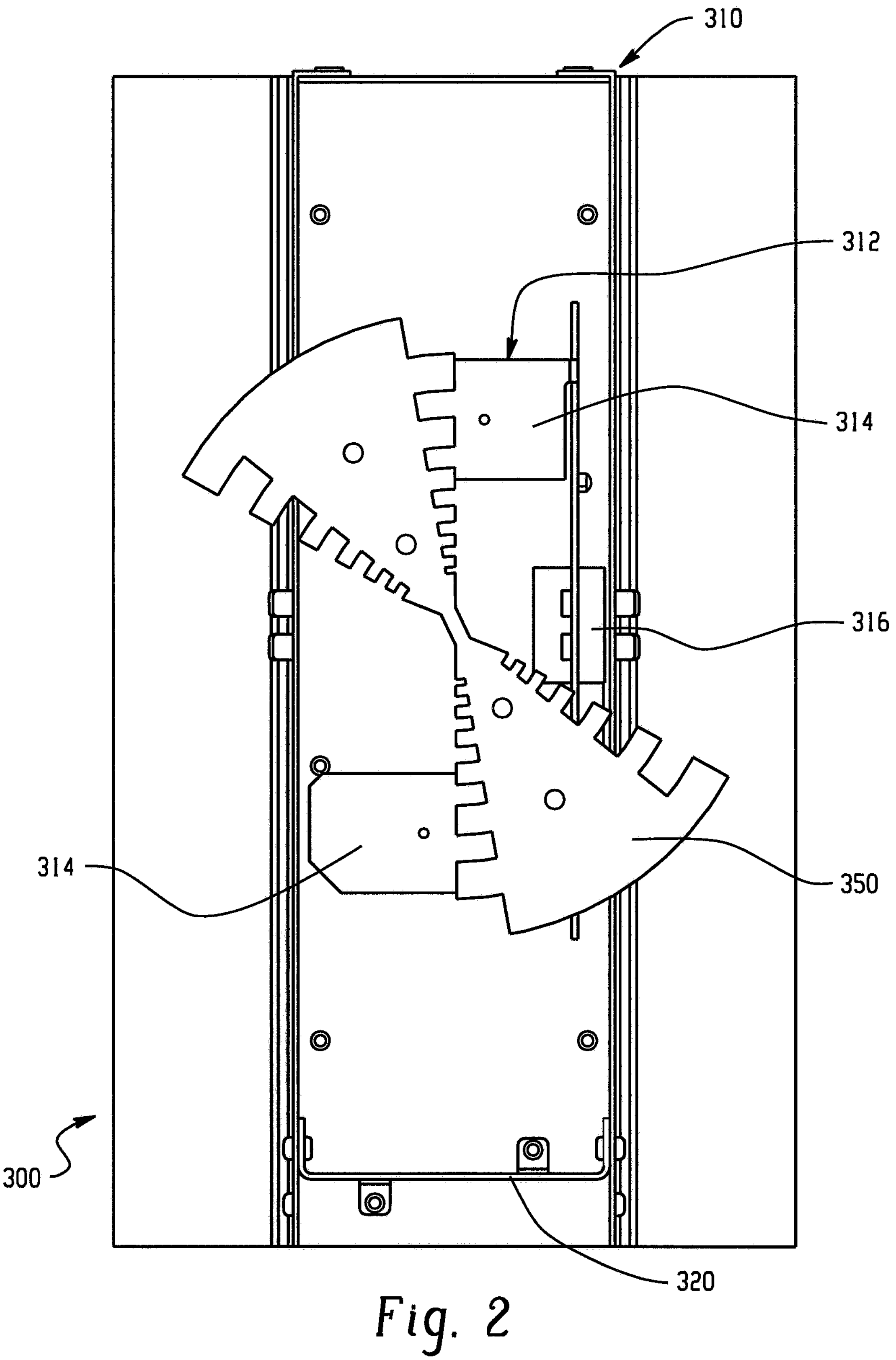
FIG. 2 is a front view of the example embodiment of FIG. 1.

With reference to FIGS. 1 and 2, a portion of an antenna array 300 is shown. Some portions of the array are not shown for ease of observation and explanation. The array 300 includes a cavity backed slot antenna portion 310 and a planar log periodic parasitic dipole portion 350. The planar log periodic parasitic dipole portion 350 is positioned at a suitable distance above or in spaced relation to the cavity backed slot antenna portion 310. This combination of elements allows the array to form elliptically polarized radiation patterns.

As shown, the cavity backed slot antenna portion 310 includes a coupling device 312 positioned in the slot of the cavity backed slot antenna portion 310. The coupling device 312 may also be referred to as a probe antenna or an exciter or radiator. The coupling device 312 primarily functions to excite the slot antenna at a suitable operating bandwidth, e.g. provide radio frequency excitation for the antenna. The coupling device 312 may take a variety of forms but, as shown, comprises plates 314, connected by a conducting bar and/or feed line 316 and supported by insulating elements 318. Although not specifically illustrated, it should be appreciated that a plurality of coupling devices 312 may be positioned along the length of the cavity backed slot antenna portion 310. The coupling devices 312 are also, in this example embodiment, separated along such length of the cavity backed slot antenna portion 310 by dividing walls 320. The dividing walls 320 may take a variety of forms; however, in at least one form, the dividing walls 320 are conductive and galvanically coupled to the cavity backed slot antenna portion 310.

Also, the planar log periodic parasitic dipole portion 350 is aligned with coupling device 312 and positioned a suitable distance above or in spaced relation to the cavity backed slot antenna portion 310. Also, a plurality of planar log periodic parasitic dipole portions 350 may be positioned along the length of the cavity backed slot antenna portion 310. Likewise, in at least one embodiment, each such planar log periodic parasitic dipole is aligned with a coupling device 312.

Figure 3:
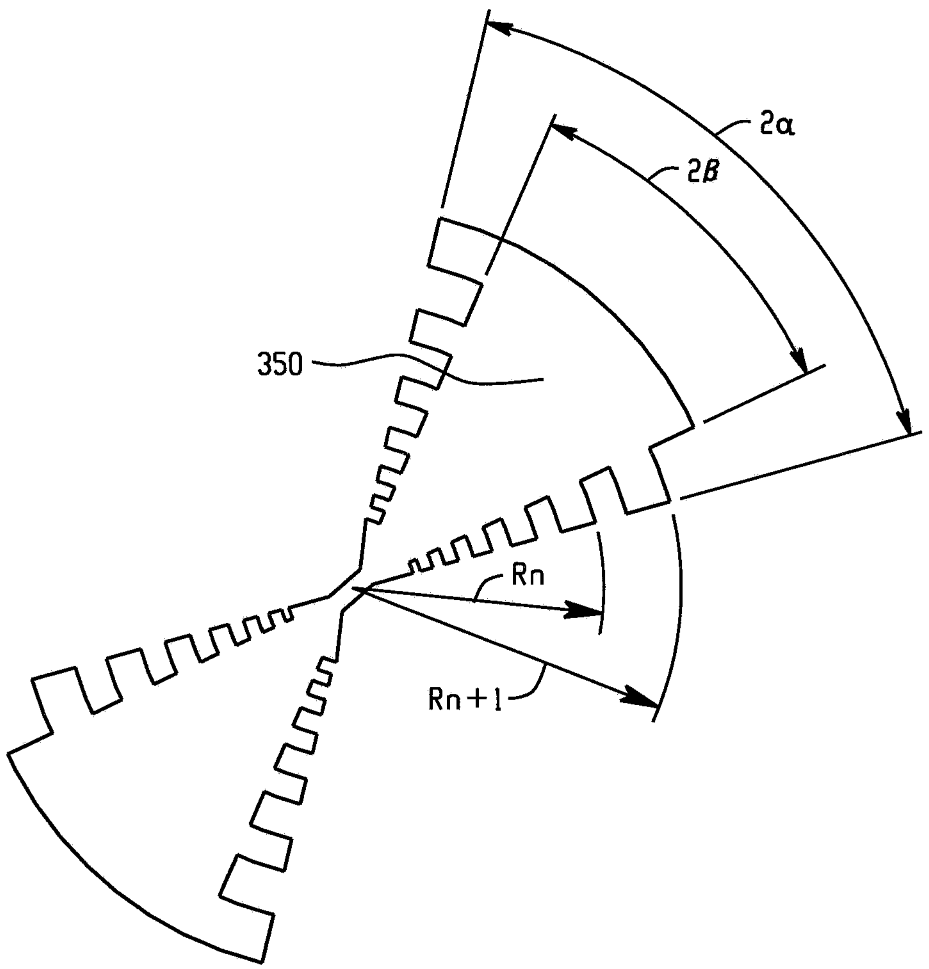
FIG. 3 is a more detailed front view of an example dipole of the embodiment of FIG. 1.

With reference now to FIG. 3, to obtain constant radiation power on the vertical polarization, the broadband planar log periodic parasitic dipole portion 350 is implemented. Desired broadband frequency characteristics are achieved by having suitable, e.g., the optimum, dipole shape. Adjusting the planar log periodic dipole's angles ($2\alpha$ and $2\beta$) and the teeth dimensions ratio ($R_n/R_{n+1}$) (where n is the tooth number along a side portion of the dipole portion 350, as shown) enables optimization of the dipole and slot antenna impedance, but still follows the Babinet's Principle formula.

$$Z_{dipole} \times Z_{slot} = 377^2/4\omega^2, \text{ where } \omega = 2\pi F$$

It should be appreciated that the noted dipole angles and teeth dimensions ratio can be determined, e.g., optimized, using any suitable techniques but, in one example, are obtained using 3-dimensional electromagnetic (EM) simulations. In one example configuration, the teeth dimensions ratio is approximately 0.84 (and, as noted below may, for example, vary between 0.7 and 0.9), the angle $\alpha$ is approximately 33 degrees (so angle $2\alpha$ is approximately 66 degrees) and the angle $\beta$ is approximately 20 degrees (so angle $2\beta$ is approximately 40 degrees). The angle $2\beta$ (or $\beta$) is a function of the impedance of the dipole. A lower value of $2\beta$ (or $\beta$) results in a higher impedance, and a higher value of $2\beta$ (or $\beta$) results in a lower impedance. Also, in this example, the number of teeth along each of the four side portions of the dipole is 7, as shown.

The log periodic configuration of the dipole provides good quality broadband performance over the desired frequency band of 470 MHz to 700 MHz. As shown, the teeth of the dipole are smaller towards the center and configured to radiate in the higher frequency ranges. Likewise, the larger teeth are positioned toward the outside of the dipole and radiate in the lower frequency ranges.

In this regard, dipole impedance Z and radiation pattern will repeat at:

$$T^n \times F(\text{MHz})$$

$$\text{where } T = Rn/Rn+1$$

$$T = 0.7 \sim 0.9$$

$$\text{Zn repeat at } T^n \times F(\text{MHz})$$

$$n = 1,2,3 \ldots$$

As further explanation:

$$\underset{\sim}{T} := \frac{R_n}{R_{n+1}}$$

where T is the ratio of the distance tooth at the order number n, n+1.

The parameter T gives the period of the structure and that structure will perform the periodic pattern and impedance behavior at the same T.

In other words, the frequency $F_{n+}1$ and $F_n$ from the adjacent periods (positions) have the same performance in terms of the pattern and impedance. So, $$\underset{\sim}{T} := \frac{F_n}{F_{n+1}} \quad F_n < F_{n+1}$$

and by forming $F_{n+1}=F_n/T$ and taking the logarithm on both, the next adjacent position has the periodic performance in a logarithmic fashion:

$$\log(F_{n+1})=\log(F_n)+\log(1/T)$$

Also, the dimensions of the dipole may vary from application to application. However, in at least one embodiment, the overall length (or diameter) of the dipole could be in the range of approximately 260 mm, which is the half wavelength of the middle frequency band of 470 MHz-700 MHz, and have a thickness of approximately 2 mm, the thickness having impact on power handle and thermal considerations. The example configuration achieves desired operation (e.g. 30% vertical polarization and 100% horizontal polarization) over the entire broad frequency bandwidth of 470 MHz to 700 MHz.

Figure 4:
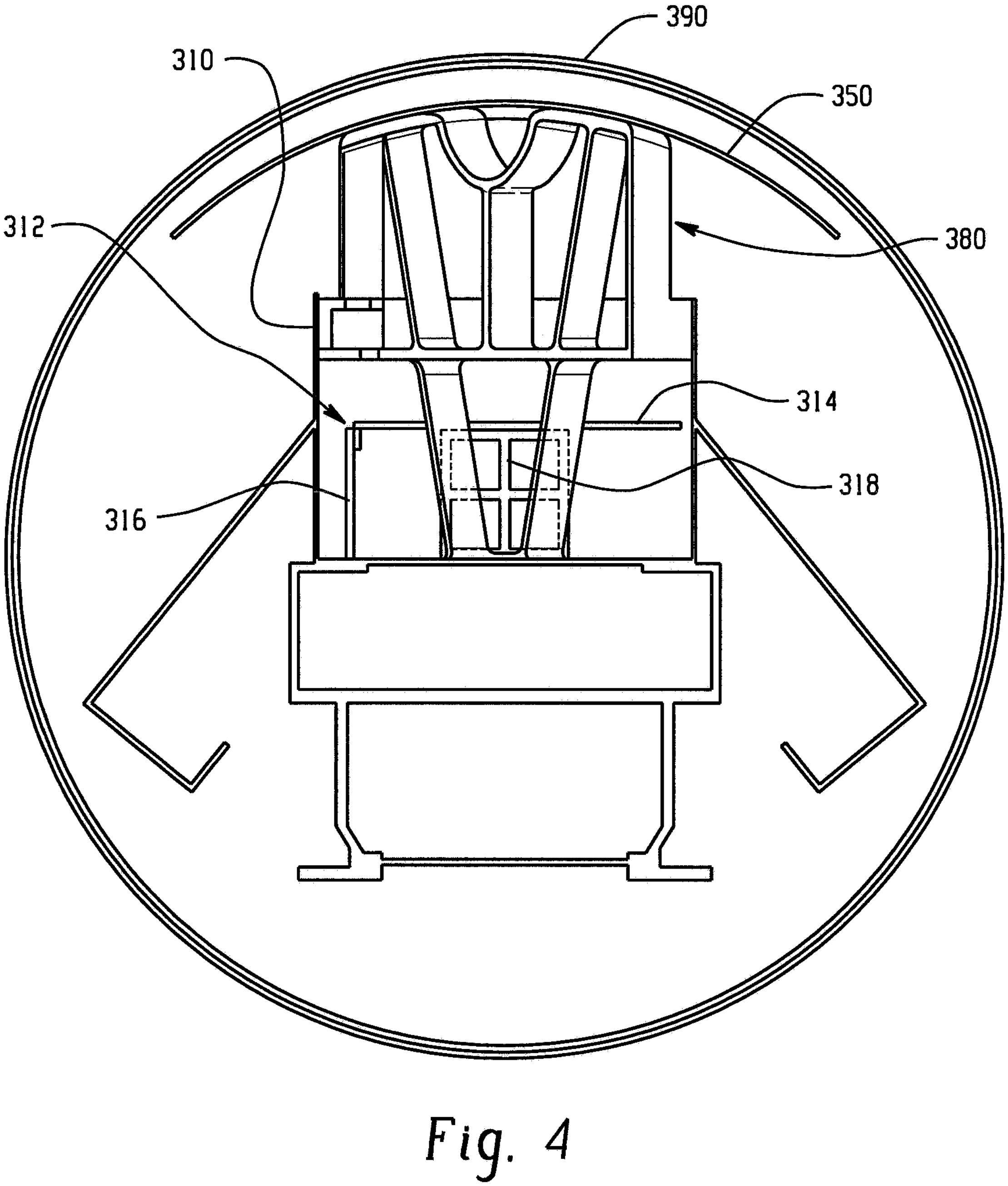
FIG. 4 is a top cross-sectional view of an example of the presently described embodiments.

The dipole is considered planar inasmuch as it is, in one form, stamped from a sheet of material, e.g. metal, and generally flat after fabrication. However, it should be appreciated that, in at least one implementation (e.g., as shown in FIG. 4), the planar dipole is bent for installation on the antenna array to accommodate a radome 390 Further, as shown, the dipole 350 is supported by a support or frame 380. In an embodiment, the dipole may comprise one or more bent or stepped portions such that the dipole may be conformal with a radome which does not have a smooth surface or form and as such the dipole will, at least in part, be non-planar.

Also, the dipole is considered parasitic because the dipole is excited by the near-field radiation of the array and is not in galvanic connection with the array. That is, the dipole 350 feeds off the excitation field generated by the coupling device 312 of the main structure of the antenna array.

The configuration of the planar log periodic parasitic dipole 350 may vary from application to application. However, any variations in configuration should take into account desired broadband frequency characteristics sought to be achieved.

With continuing reference to FIG. 4, a top view of the antenna array 300 is shown. As shown, the cavity backed slot portion 310 is spaced from the planar log periodic parasite dipole portion 350, as previously described. The dipole portion 350 is shown in a bent or curved configuration to accommodate the radome 390 of the antenna array. The coupling device 312 is shown. The coupling device 312 comprises, as previously described, plates 314, a conducting bar and/or feed line 316, and supports and/or insulating elements 318. Notably, a support 380 is illustrated in FIG. 4. The support or frame 380 is, in at least one form, a dielectric frame or support. The planar log periodic dipole 350 can be seen in this example embodiment to have a gap between an upper surface thereof and an internal surface of the radome 390. The gap is shown to have an air dielectric in FIG. 4, but alternatively could be a mixture of air and a solid or part-solid dielectric material or the gap could be filled with a 100% solid dielectric material. The gap may comprise one or more layers of the same or different dielectric materials. In an embodiment, there may be no gap between an upper surface of the planar log periodic dipole 350 and an internal surface of the radome 390.

Figure 5A:
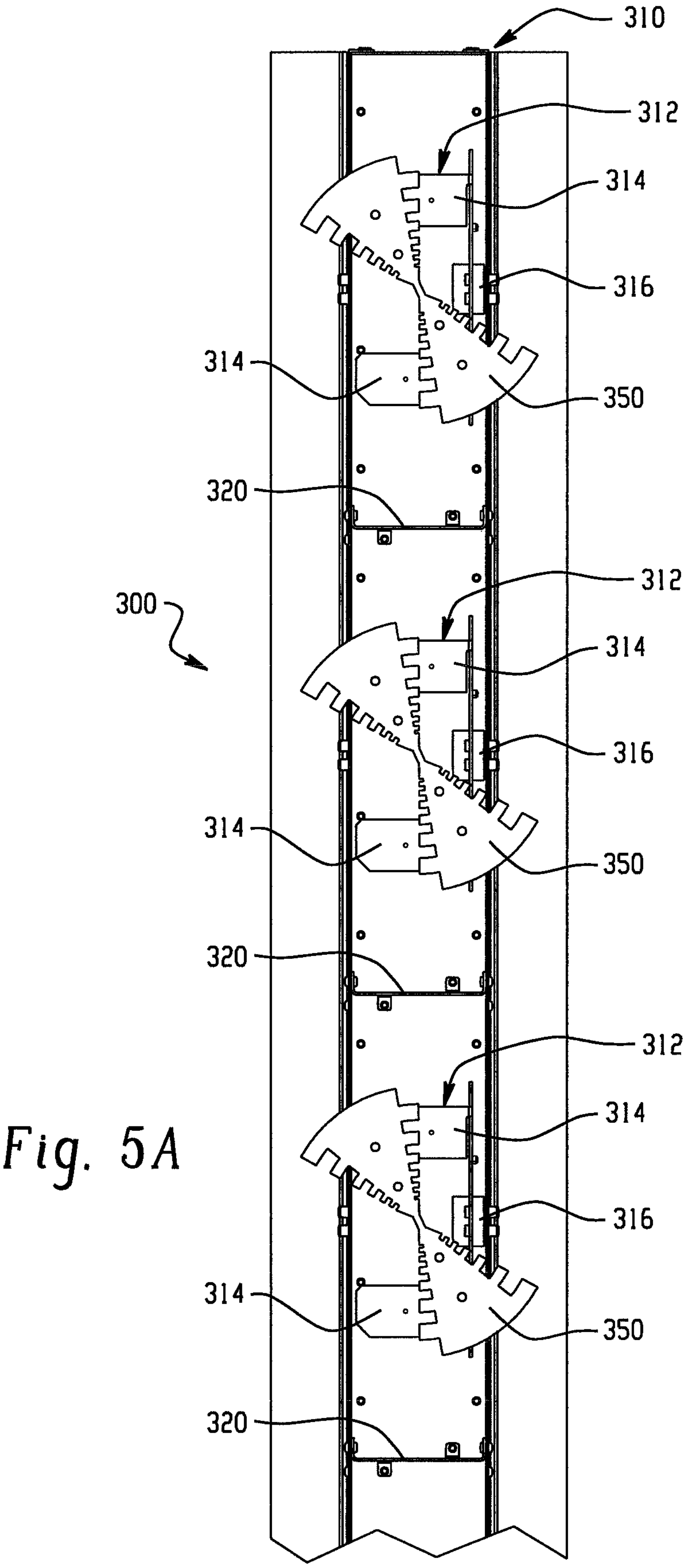
FIG. 5(*a*) is a front view of an example embodiment of the presently described embodiments.
Figure 5B:
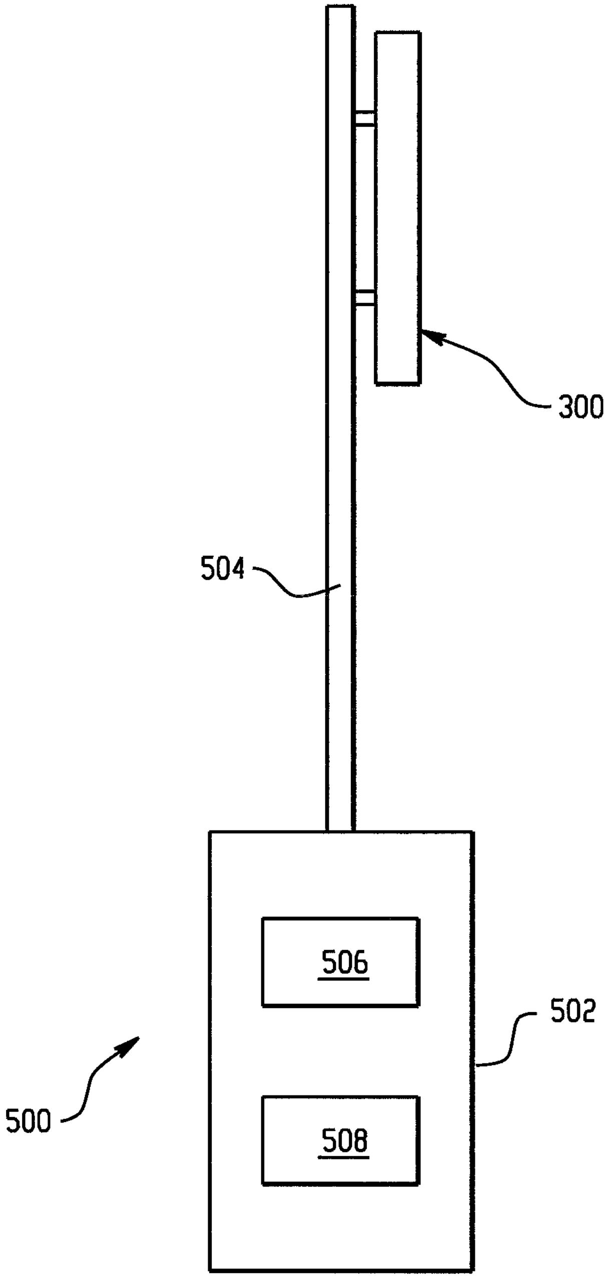

As has been alluded to in connection with FIGS. 1-4, the embodiments described may comprise an antenna array, in some embodiments, or a single antenna element, in other embodiments. As shown in FIG. 5(*a*), if an array is implemented, it is to be appreciated that, in at least one form, the array comprises a cavity backed slot antenna portion including a plurality of coupling devices 312 configured to provide radio frequency excitation for the antenna array. The plurality of coupling devices 312 are positioned along a length of the cavity backed slot antenna portion. Also, a plurality of planar log periodic parasitic dipole portions 350 are positioned in spaced relation to the cavity backed slot antenna portion 310, each of the plurality of planar log periodic parasitic dipole portions being aligned with a single coupling device. The planar log periodic parasitic dipole portions each have a dipole angle and teeth.

With reference to FIG. 5(*b*), it should be appreciated that an array 300 may be implemented in a system 500. The system 500 may include a communication device 502. The communication device 502 may take a variety of forms, including and not limited to, for example, a base station. In an embodiment the communication device 502 may be at least one of: a network device, a radio access point, a line of sight (LOS) radio device, a broadcast device (transmit only), a reception device (receive only), and a portable or mobile communications device. The array 300 as shown in FIG. 5(*b*) is connected to a mast 504 that extends from the communication device 502. It should be understood that the communication device 502 could have a variety of configurations, but in one form, includes a transmitter 506 and/or receiver 508 coupled to the antenna array through the base station and mast (e.g., using suitable components (not shown) of the configuration that may include, for example, transmission lines or the like). In an embodiment, the array 300 may be integral with the communication device 502 such that no mast 504 is required. The array 300 may be electrically coupled to the communication device 502, for example, via one or more transmission lines (not illustrated in FIG. 5(*b*)).

In operation, the presently described embodiments use the broadband planar log periodic parasitic dipole to achieve broadband elliptically polarized radiation and broadband input impedance matching at desired levels. The presently describe embodiments have the advantages of low cost, single or dual input port options and broadband performance both for the radiation pattern and return loss.

Figure 6:
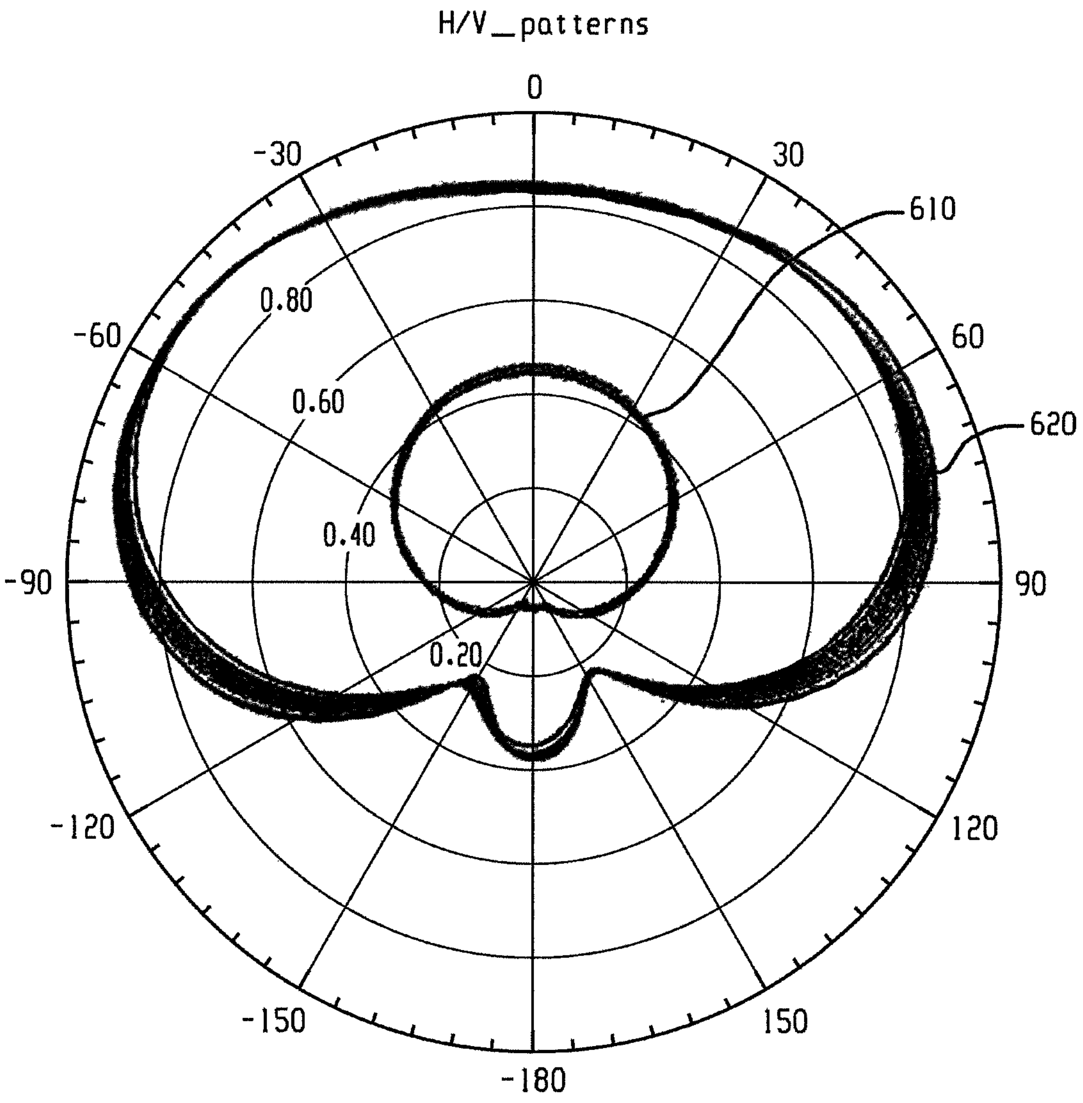
FIG. 6 is a graph showing Azimuth radiation patterns for vertical and horizontal polarization in a frequency range of 470 MHz to 700 MHz; and, FIG. 7 is a graph showing antenna input port return loss in a frequency range of 470 MHz to 700 MHz.

Regarding performance, FIG. 6 illustrates Azimuth farfield radiation patterns for both horizontal and vertical polarizations from 470 MHz to 700 MHz for the presently described embodiments. As shown, the inner pattern 610 represents the vertical polarization component and the outer pattern 620 represents the horizontal polarization component. Each of these inner and outer patterns, respectively, shows curves for different frequencies over the 470 MHz to 700 MHz range. The curves for the inner patterns are tightly grouped. And, the curves for the outer pattern are tightly grouped. This tight grouping of curves in the respective patterns illustrates that the presently described embodiments achieve the 30%/100% constant power ratio over the desired range of 470 MHz to 700 MHz.

Figure 7:
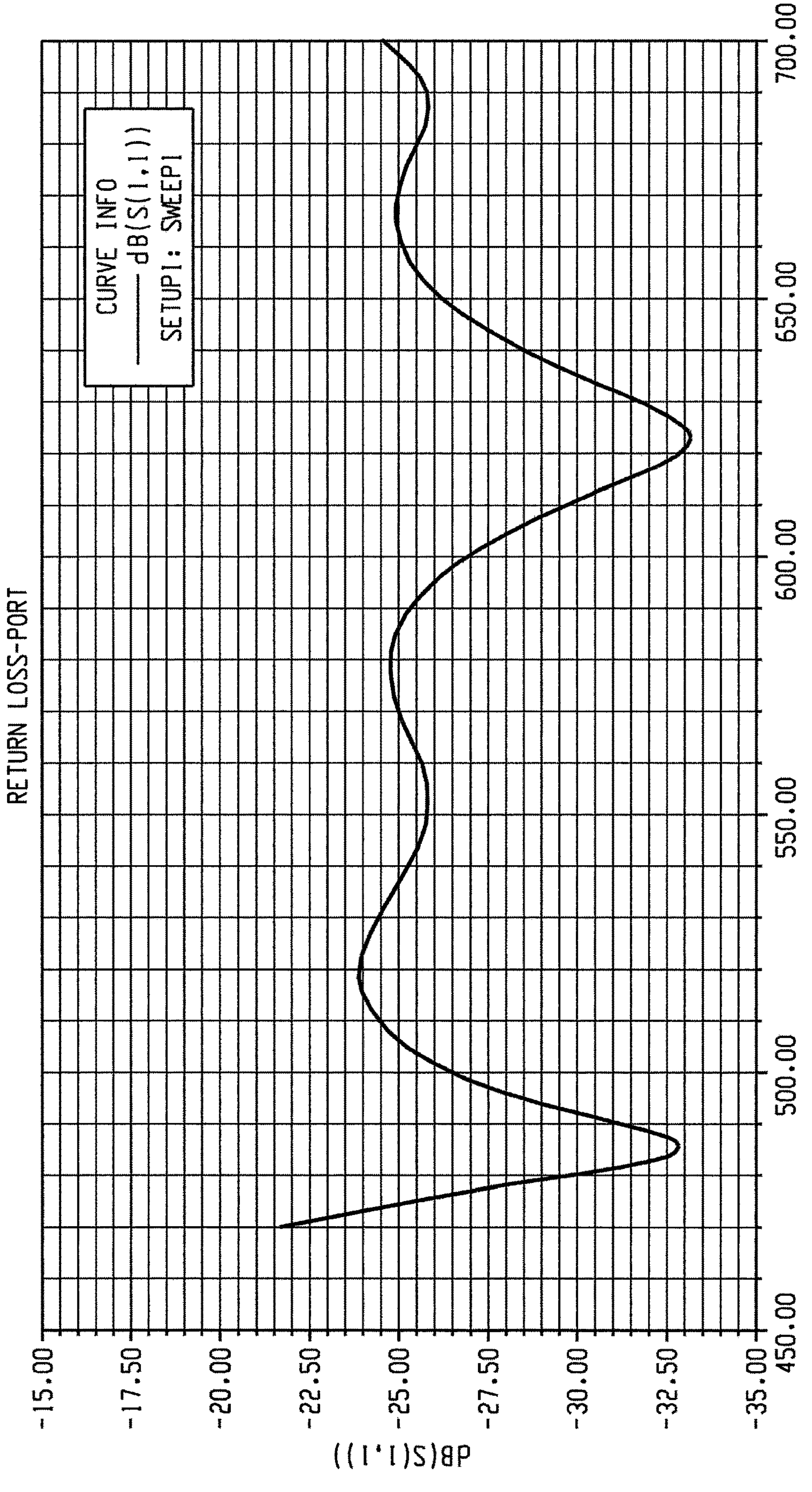

Referring to FIG. 7, antenna input port return loss over the range of 470 MHz to 700 MHz is shown. This, too, illustrates improved performance.

The exemplary embodiments have been described with reference to the preferred embodiments. Obviously, modifications and alterations will occur to others upon reading and understanding the preceding detailed description. It is intended that the exemplary embodiments be construed as including all such modifications and alterations insofar as they come within the scope of the appended claims or the equivalents thereof.

The invention claimed is:

1. An antenna comprising:

a cavity backed slot antenna portion having positioned therein a coupling device comprising at least one of a probe antenna, exciter or radiator configured to provide radio frequency excitation for the antenna; and, a planar log periodic parasitic dipole portion positioned in spaced relation to the cavity backed slot antenna portion, wherein the cavity backed slot antenna portion and the planar log periodic parasitic dipole portion are configured to produce elliptically polarized radiation patterns.

2. The antenna as set forth in claim 1 wherein the planar log periodic parasitic dipole portion has a dipole angle and teeth, the dipole angle and teeth being configured to define impedance of the antenna.

3. The antenna as set forth in claim 1 wherein a plurality of planar log periodic parasitic dipole portions are positioned along a length of the cavity backed slot antenna portion.

4. The antenna as set forth in claim 1 wherein the coupling device is aligned with the planar log periodic parasitic dipole portion.

5. The antenna as set forth in claim 1 wherein the coupling device comprises plates connected by a conducting bar.

6. An antenna configured to produce elliptically polarized radiation patterns, the antenna comprising:

a cavity backed slot antenna portion including a coupling device configured to provide radio frequency excitation for the antenna; and, a planar log periodic parasitic dipole portion positioned in spaced relation to the cavity backed slot antenna portion and aligned with the coupling device, the planar log periodic parasitic dipole portion having a dipole angle and teeth dimensions ratio determined such that the cavity backed slot antenna portion and the planar log periodic parasitic dipole portion produce the elliptically polarized radiation patterns.

7. The antenna as set forth in claim 6 wherein the dipole angle and teeth are configured to define impedance of the antenna.

8. The antenna as set forth in claim 6 further comprising a plurality of planar log periodic parasitic dipole portions positioned along a length of the cavity backed slot antenna portion.

9. The antenna as set forth in claim 8 further comprising a plurality of coupling devices in the cavity backed slot antenna portion, each aligned with a single planar log periodic parasitic dipole portion.

10. The antenna as set forth in claim 6 wherein the coupling device comprises plates connected by a conducting bar.

11. An antenna array configured to produce elliptically polarized radiation patterns, the antenna array comprising:

a cavity backed slot antenna portion including a plurality of coupling devices configured to provide radio frequency excitation for the antenna array, the plurality of coupling devices being positioned along a length of the cavity backed slot antenna portion; and, a plurality of planar log periodic parasitic dipole portions positioned in spaced relation to the cavity backed slot antenna portion, each of the plurality of planar log periodic parasitic dipole portions being aligned with a single coupling device, the planar log periodic parasitic dipole portions each having a dipole angle and teeth dimensions ratio determined such that the cavity backed slot antenna portion and the planar log periodic parasitic dipole portions produce the elliptically polarized radiation patterns.

12. The antenna array as set forth in claim 11 wherein the dipole angle and teeth are configured to define impedance of the antenna.

13. The antenna array as set forth in claim 11 wherein each coupling device comprises plates connected by a conducting bar.

14. The antenna array as set forth in claim 11 further comprising dividing walls positioned in the cavity backed slot antenna portion to separate coupling devices.

15. A system comprising:

a communication device comprising at least one of a transmitter and a receiver; and, an antenna coupled to at least one of the transmitter and the receiver of the communication device, the antenna comprising a cavity backed slot antenna portion having positioned therein a coupling device comprising at least one of a probe antenna, exciter or radiator configured to provide radio frequency excitation for the antenna and a planar log periodic parasitic dipole portion positioned in spaced relation to the cavity backed slot antenna portion, wherein the cavity backed slot antenna portion and the planar log periodic parasitic dipole portion are configured to produce elliptically polarized radiation patterns.

16. The system as set forth in claim 15 wherein the communication device is a base station.

17. The system as set forth in claim 15 wherein the planar log periodic parasitic dipole portion halving a dipole angle and teeth.

18. The system as set forth in claim 15 wherein a plurality of planar log periodic parasitic dipole portions are positioned along a length of the cavity backed slot antenna portion.

19. The system as set forth in claim 15 wherein the coupling device is aligned with the planar log periodic parasitic dipole portion.

* * * * *